(12) United States Patent
McGinniss et al.

(10) Patent No.: US 11,995,493 B2
(45) Date of Patent: May 28, 2024

(54) TRANSFER OF RFID INLAYS FROM A FIRST SUBSTRATE TO A SECOND SUBSTRATE

(71) Applicant: Avery Dennison Retail Information Services LLC, Mentor, OH (US)

(72) Inventors: Edward McGinniss, Clinton, SC (US); Carol Callahan, Greensboro, NC (US); Peter Cockerell, Buckinghamshire (GB)

(73) Assignee: Avery Dennison Retail Information Services LLC, Mentor, OH (US)

( * ) Notice: Subject to any disclaimer, the term of this patent is extended or adjusted under 35 U.S.C. 154(b) by 0 days.

(21) Appl. No.: 17/760,368

(22) PCT Filed: Feb. 11, 2021

(86) PCT No.: PCT/US2021/017650
§ 371 (c)(1),
(2) Date: Aug. 9, 2022

(87) PCT Pub. No.: WO2021/163318
PCT Pub. Date: Aug. 19, 2021

(65) Prior Publication Data
US 2023/0116570 A1      Apr. 13, 2023

Related U.S. Application Data

(60) Provisional application No. 62/975,398, filed on Feb. 12, 2020.

(51) Int. Cl.
*G06K 19/077* (2006.01)
(52) U.S. Cl.
CPC . *G06K 19/07718* (2013.01); *G06K 19/07749* (2013.01)

(58) Field of Classification Search
CPC .................................................. G06K 19/07718
(Continued)

(56) References Cited

U.S. PATENT DOCUMENTS

| | | |
|---|---|---|
| 2004/0001000 A1 | 1/2004 | Redlin |
| 2004/0020040 A1 | 2/2004 | Arneson et al. |

(Continued)

FOREIGN PATENT DOCUMENTS

| | | |
|---|---|---|
| JP | 2005-044270 | 2/2005 |
| JP | 2008-204139 | 9/2008 |

(Continued)

OTHER PUBLICATIONS

International Preliminary Report on Patentability dated Aug. 11, 2022 issued in corresponding IA No. PCT/US2021/017650 filed Feb. 11, 2021.

(Continued)

*Primary Examiner* — Rafferty D Kelly

(57) ABSTRACT

Systems and methods are provided for transferring a remote frequency identification (RFID) inlay from a first substrate to a second substrate. An RFID inlay is secured to a first substrate with a first adhesive. The RFID inlay is brought into the vicinity of a second substrate and secured to the second substrate with a second adhesive. The RFID inlay is then dissociated from the first substrate. The RFID inlay may be dissociated from the first substrate by softening the first adhesive, such as by the application of heat or the application of a softening substance. Alternatively, the RFID inlay may be dissociated from the first substrate without softening the first adhesive, but rather by differential release, whereby a release force is applied between the two substrates, with the release force being greater than the release strength of the first adhesive, but less than the release strength of the second adhesive.

19 Claims, 4 Drawing Sheets

(58) Field of Classification Search
USPC .......................................................... 235/491
See application file for complete search history.

(56) References Cited

U.S. PATENT DOCUMENTS

| | | |
|---|---|---|
| 2004/0026754 A1 | 2/2004 | Liu et al. |
| 2004/0141790 A1 | 7/2004 | Waters |
| 2005/0000634 A1 | 1/2005 | Craig et al. |
| 2005/0183264 A1 | 8/2005 | Eckstein et al. |
| 2007/0035466 A1* | 2/2007 | Coleman .......... G06K 19/07752 343/702 |
| 2007/0057796 A1 | 3/2007 | Craig et al. |
| 2007/0139205 A1 | 6/2007 | Tanaka et al. |
| 2009/0108993 A1 | 4/2009 | Forster |
| 2010/0078487 A1 | 4/2010 | Baba et al. |
| 2021/0091474 A1 | 3/2021 | Escaro et al. |

FOREIGN PATENT DOCUMENTS

| | | |
|---|---|---|
| JP | 2009-086968 | 4/2009 |
| JP | 2010-086361 | 4/2010 |
| JP | 2010-092143 | 4/2010 |
| JP | 2019-146042 | 8/2019 |
| WO | 2006/016559 | 2/2006 |

OTHER PUBLICATIONS

International Search Report and Written Opinion dated May 21, 2021 issued in corresponding IA No. PCT/US2021/017650 filed Feb. 11, 2021.

* cited by examiner

TRANSFER OF RFID INLAYS FROM A FIRST SUBSTRATE TO A SECOND SUBSTRATE

CROSS-REFERENCE TO RELATED APPLICATION

The present application is a 371 of International application No. PCT/US2021/017650, which was published in English on Aug. 19, 2021, and claims the benefit of U.S. Provisional Patent Application No. 62/975,398 filed Feb. 12, 2020, both of which are incorporated herein by reference in their entireties.

FIELD OF THE DISCLOSURE

The present subject matter relates to radio frequency identification ("RFID") devices. More particularly, the present subject matter relates to systems and methods for transferring RFID inlays from one substrate to another.

BACKGROUND

RFID tags and labels (collectively referred to herein as "devices") are widely used to associate an object with an identification code. RFID devices generally include an antennae and analog and/or digital electronics, which may include, for example, communications electronics, data memory, and control logic. RFID devices can be used for a variety of applications, for example, security locks in cars, access control to buildings, and tracking inventory and parcels.

One difficulty associated with RFID devices is securing the functional components (namely, an RFID chip and associated antenna) or "RFID inlay" to certain materials, such as ultra-soft fabric or very thin materials or exotic/unconventional materials, using conventional techniques. Providing an approach to securing an RFID inlay to such materials would be advantageous, particularly if such an approach also allowed for reduced manufacturing costs and promoted sustainability (i.e., reuse of selected materials used during the manufacturing process).

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as may be set forth in the claims appended hereto.

Methods for transferring an RFID inlay are described herein. In some embodiments, the RFID inlay contains a chip electrically coupled to an antenna. The chip can be electrically coupled to an antenna using techniques known in the art. In some embodiments, the chip is electrically conducted to an antenna using a conductive adhesive. In some embodiments, the chip can be attached using a "direct-attach" process or a "strap attach" process. In some embodiments, the antenna can be formed of materials known in the art. In some embodiments, the antenna is formed from a metal or metallic material, such as aluminum, copper, or nickel. In some embodiments, the metallic material is a metallic foil. In other embodiments, the antenna is formed using a conducting ink.

In some embodiments, the method includes securing an RFID inlay to a first substrate. In some embodiments, the first substrate is a conventional material, for example, polymeric (e.g., PET) materials, cellulose-based materials (e.g., paper), textiles, fabrics, knits, etc. In some embodiments, the inlay can be secured using techniques known in the art. In some embodiments, the inlay is secured to the substrate using an adhesive. In some embodiments, the adhesive is applied in any desired pattern or configuration. In some embodiments, the adhesive is applied in a shape or pattern that is desired for an antenna. In some embodiments, the first adhesive is a conductive adhesive.

In some embodiments, the RFID inlay is then brought into the vicinity of a second substrate and secured to the second substrate with a second adhesive. In some embodiments, the second substrate is a conventional substrate as described above. In other embodiments, the second substrate is an unconventional material, for example, an ultra-soft fabric or very thin material or exotic material In some embodiments, the RFID inlay is then dissociated from the first substrate.

DETAILED DESCRIPTION

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
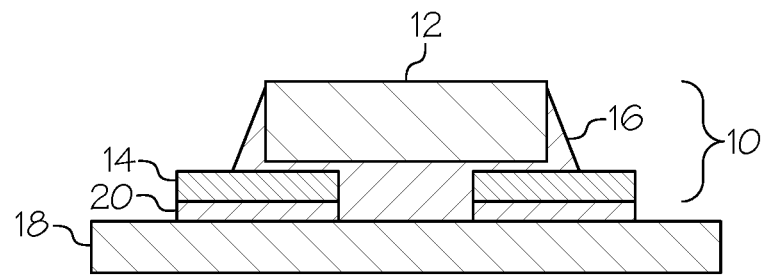
FIG. 1 is schematic cross sectional view of an exemplary embodiment of an RFID inlay secured to a first substrate.

FIG. 1 illustrates an exemplary RFID inlay 10 according to the present disclosure. The RFID inlay 10 of FIG. 1 includes an RFID chip 12 (which may be variously configured without departing from the scope of the present disclosure) that is electrically coupled to an antenna 14 (which also may be variously configured without departing from the scope of the present disclosure). In the illustrated embodiment, the RFID chip 12 is coupled to the antenna 14 by a conductive adhesive 16, but different means for coupling the RFID chip 12 to the antenna 14 may be employed without departing from the scope of the present disclosure.

The RFID inlay 10 is secured to a conventional substrate 18 (e.g., formed of a paper or polyethylene terephthalate material) by an adhesive 20. The manner in which the RFID inlay 10 is assembled and secured to the substrate 18 may vary without departing from the scope of the present disclosure. In one embodiment, the substrate 18 is provided as a web of material that is unwound from a reel. The adhesive 20 is applied to the substrate 18 as the substrate 18 is unwound from the reel or, alternatively, if the adhesive 20 is already present on the substrate 18, a liner is removed to expose the adhesive 20 as the substrate 18 is unwound from the reel. In one embodiment, the adhesive 20 is applied in the shape that is desired for an antenna 14 of the RFID inlay 10, but the adhesive 20 may be otherwise applied or configured without departing from the scope of the present disclosure.

The substrate 18 with exposed adhesive 20 continues unwinding from the reel, with a conductive material being applied to at least portions of the adhesive 20. The conductive material may be applied according to any suitable approach and in any pattern without departing from the scope of the present disclosure, but according to one exemplary embodiment, a web of conductive material (e.g., an aluminum foil) is provided, with the conductive material being unwound from a reel and brought into contact with the adhesive 20. The conductive material (if not provided in a final configuration) is formed into the shape of an antenna (e.g., using a die- or laser-cutting procedure) and then any excess material is removed by any suitable approach. In one exemplary embodiment, the adhesive 20 is provided in the shape that is desired for the antenna 24, in which case the conductive material may be stripped away from the substrate 18, which leaves only the portions of the conductive material in contact with the patterned adhesive 20, as an antenna 14. The substrate 18 (with the conductive material in the shape of an antenna 14) is then wound onto a second reel. By employing such a reel-to-reel process, a plurality of antennas 14 may be sequentially applied to the substrate 18, allowing for the efficient creation of a plurality of RFID inlays 10.

The substrate 18 (with the plurality of antennas 14) is subsequently unwound from the reel and a chip adhesive 16 is sequentially applied to each antenna 14. An RFID chip 12 is then applied to the chip adhesive 16 (using a "direct chip attach" approach or a "strap attach" approach, for example) to electrically couple the RFID chip 12 to an associated antenna 14. This may include applying pressure and/or heat to cure the chip adhesive 16 and bond the RFID chip 12 to the antenna 14, thereby forming an RFID inlay 10. Following formation, each RFID inlay 10 may be tested, with the substrate 18 (with the plurality of RFID inlays 10) being wound onto another reel. Again, it should be understood that the preceding approach to assembling an RFID inlay 10 and securing the RFID inlay 10 to an initial substrate 18 is merely exemplary and that any other suitable approach may be employed without departing from the scope of the present disclosure.

Figure 2:
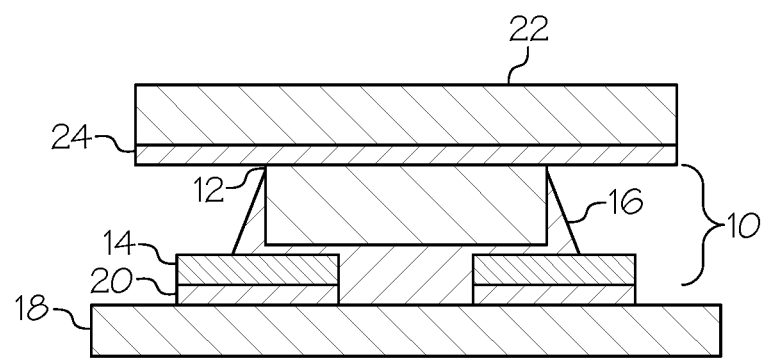
FIG. 2 is schematic cross sectional view of the RFID inlay of FIG. 1, temporarily secured to both the first substrate and a second substrate.

With the RFID inlay 10 secured to the substrate 18, a second substrate 22 is secured to the RFID inlay using a second adhesive 24, as in FIG. 2. As described above, the first substrate 18 is formed of a conventional substrate material. While the second substrate 22 may also be formed of a conventional substrate material, it may instead be formed of an unconventional material (e.g., an ultra-soft fabric or very thin material or exotic material) that is not well-suited for conventional approaches to applying an RFID inlay to a substrate (e.g., the above-described approach to applying the RFID inlay 10 to the first substrate 18).

Figure 3:
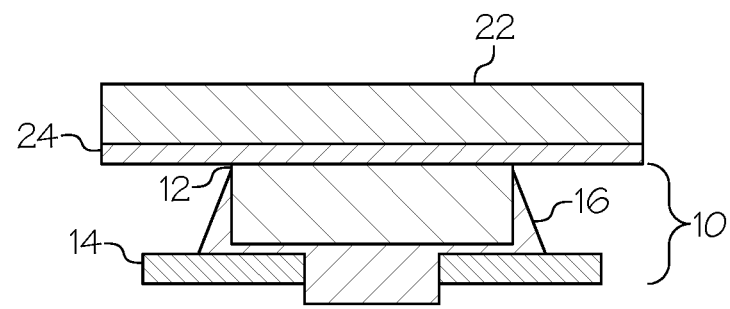
FIG. 3 is schematic cross sectional view of the RFID inlay of FIG. 2, secured to the second substrate after dissociation from the first substrate.

When the RFID inlay 10 has been secured to the second substrate 22, the first substrate 18 is dissociated from the RFID inlay 10, leaving the RFID inlay 10 secured only to the second substrate 22, as in FIG. 3. Subsequently, an additional or third substrate (e.g., a liner) may be applied to the RFID inlay 10, with the RFID inlay 10 positioned between the second substrate 22 and the third substrate. The first substrate 18 may be dissociated from the RFID inlay 10 using any one of a variety of different approaches and systems, with exemplary approaches and systems to be described herein in greater detail.

Figure 4:
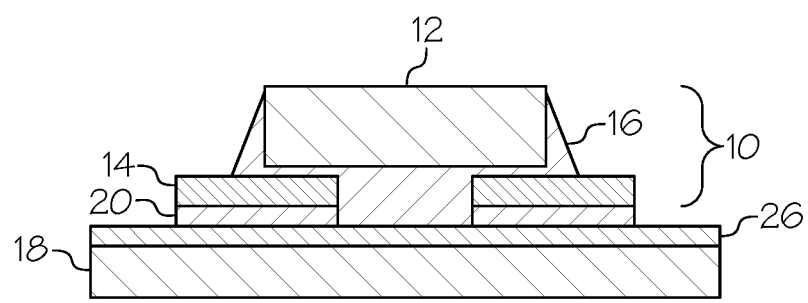
FIG. 4 is schematic cross sectional view of another exemplary embodiment of an RFID inlay secured to a first substrate.
Figure 5:
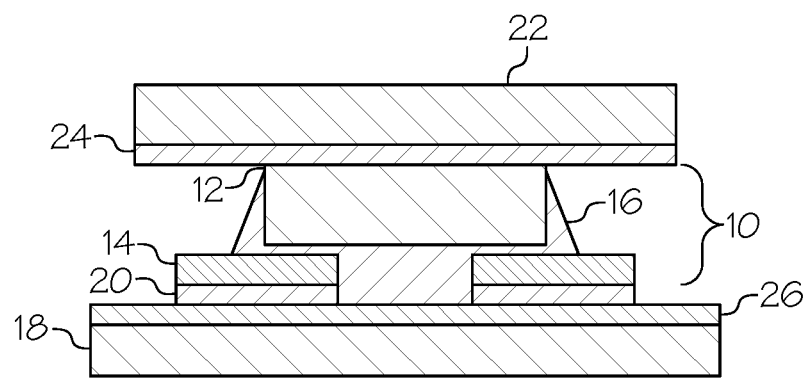
FIG. 5 is schematic cross sectional view of the RFID inlay of FIG. 4, temporarily secured to both the first substrate and a second substrate.

It should be understood that the assemblies of FIGS. 1 and 2 are merely exemplary and that other RFID inlay/first substrate configurations may be employed without departing from the scope of the present disclosure. For example, in an alternative embodiment, an additional layer 26 (e.g., a thermal transfer adhesive layer) is provided between the first substrate 18 and the first adhesive 20 (FIG. 4). The assembly of FIG. 4 may be manufactured according to any suitable approach, including an approach of the type described above. If the above-described approach were employed, an additional step of applying the additional layer 26 to the first substrate 18 is provided before the first adhesive 20 is applied, with the first adhesive 20 being applied to the additional layer 26, rather than being applied directly to the first substrate 18. Subsequently, a second substrate 22 may be secured to the RFID inlay 10 according to any suitable approach (including the above-described approach), resulting in the assembly of FIG. 5. Finally, the RFID inlay 10 is dissociated from the first substrate 18 using a method and/or system according to the present disclosure, resulting in the assembly of FIG. 3.

Figure 6:
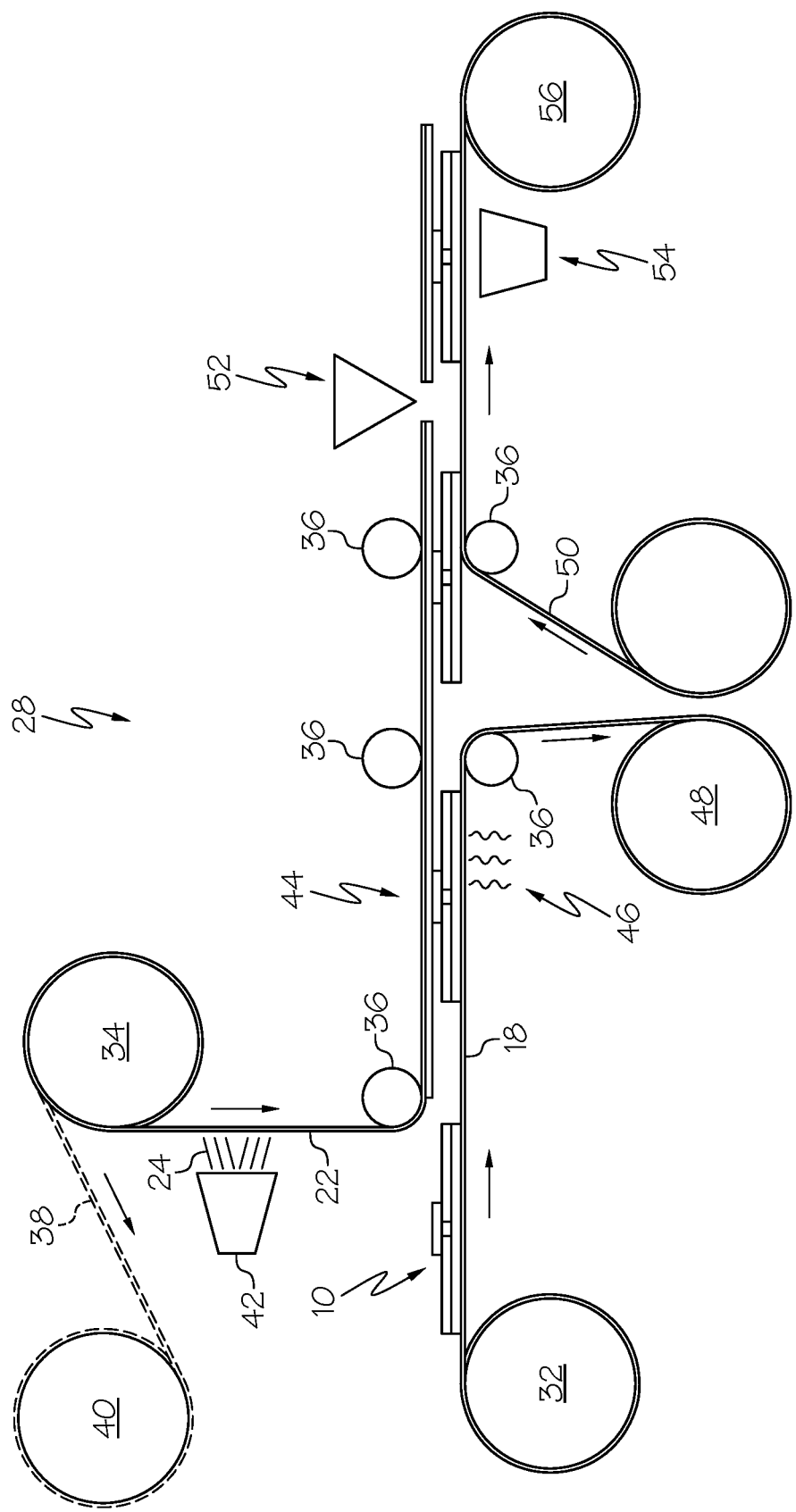
FIG. 6 is a diagrammatic view of an exemplary embodiment of a system for transferring RFID inlays from a first substrate to a second substrate.
Figure 7:
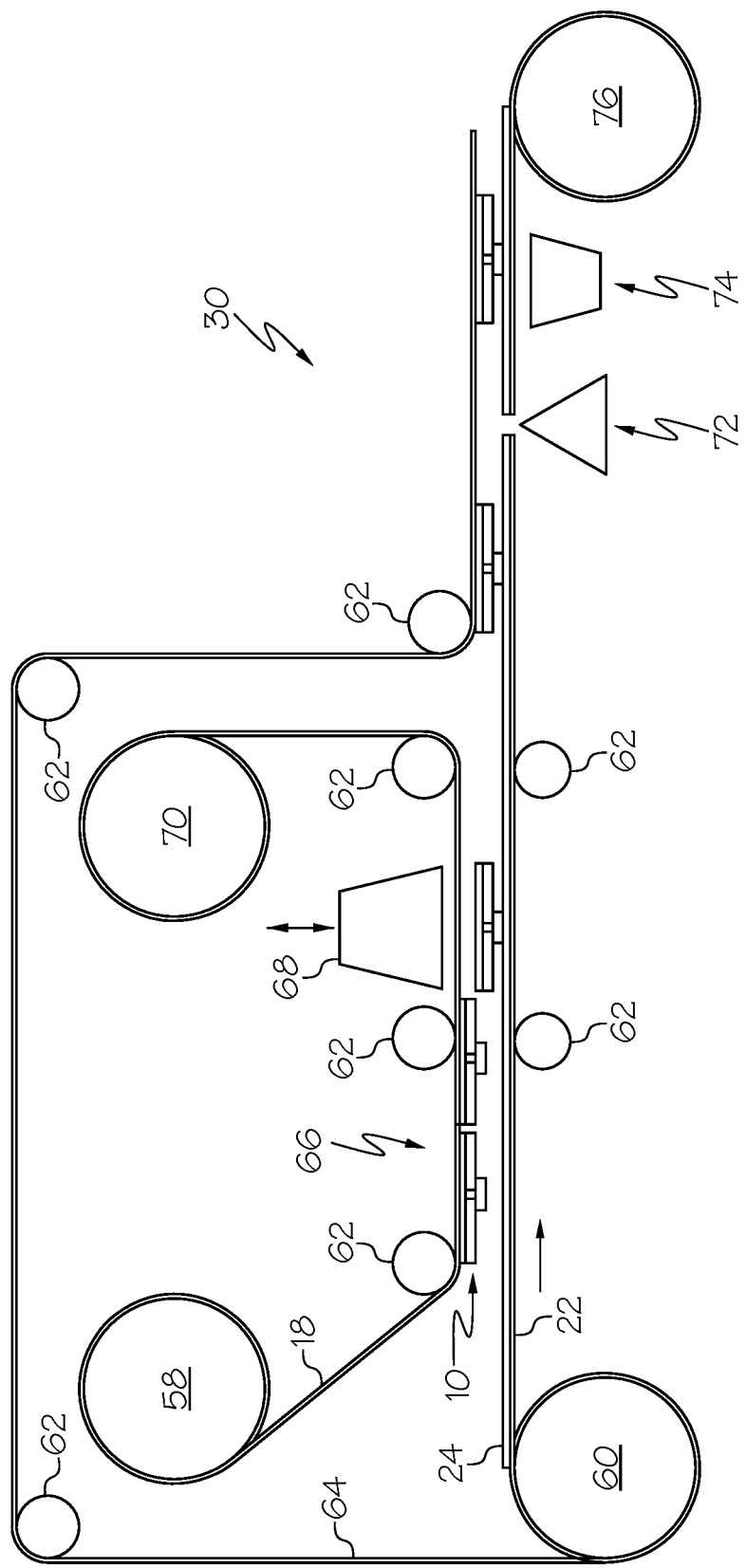
FIG. 7 is a diagrammatic view of another exemplary embodiment of a system for transferring RFID inlays from a first substrate to a second substrate.

FIGS. 6 and 7 illustrate exemplary systems 28 and 30 for transferring an RFID inlay 10 from a first substrate 18 to a second substrate 22. It should be understood that the illustrated systems 28 and 30 and the associated transfer methods are merely exemplary and that differently configured systems and methods may be employed without departing from the scope of the present disclosure.

In the system 28 of FIG. 6, a first substrate 18 having a plurality of RFID inlays 10 secured thereto (as in FIG. 1 or 4, for example) is provided on a reel 32. In the embodiment of FIG. 6, the second substrate 22 is also provided on a reel 34. Both of the substrates 18 and 22 are unwound from their respective reels 32 and 34 by any suitable mechanism (e.g., rollers 36 in the illustrated embodiment). If the second substrate 22 is provided with a layer of adhesive 24 and a liner 38, the liner 38 may be unwound from the second substrate 22 onto a reel 40 to expose the adhesive 24. On the other hand, if the second substrate 22 does not include adhesive, an adhesive applicator 42 may be provided to apply adhesive 24 (e.g., in the form of a spray) to the second substrate 22 as the second substrate 22 is unwound from the reel 34.

Regardless of how the adhesive 24 is applied to the second substrate 22, the RFID inlay 10 is brought into the vicinity of the second substrate 22, with the adhesive 24 on the second substrate 22 facing the RFID inlay 10 on the first substrate 18. With the RFID inlay 10 in the vicinity of the second substrate 22 (as at the location identified in FIG. 6 at 44), the RFID inlay 10 is secured to the second substrate 22 using the adhesive 24 on the second substrate 22. This results in the configuration shown in FIG. 2 or 4, for example, with the RFID chip 12 in contact with the adhesive 24 on the second substrate 22, while the antenna 14 is in contact with the adhesive 20 on the first substrate 18.

With the RFID inlay 10 secured to the second substrate 22, the RFID inlay 10 is next dissociated from the first substrate 18. This may include first softening the adhesive 20 on the first substrate 18 before dissociating the RFID inlay 10 and the first substrate 18 or instead dissociating the RFID inlay 10 from the first substrate 18 without first softening the adhesive 20 on the first substrate 22. The adhesive 20 on the first substrate 18 may be softened by any of a number of possible approaches, which depend upon the nature of the adhesive 20. In one embodiment, heat is applied to soften the adhesive 20 on the first substrate 18 (as indicated at 46 in FIG. 6). In another embodiment, a softening substance or agent (e.g., a solvent) is applied to soften the adhesive 20 on the first substrate 18. Once the adhesive 20 on the first substrate 18 has been softened, the two substrates 18 and 22 are moved apart from each other (e.g., by directing the first substrate 18 in a direction away from the second substrate 22, as in FIG. 6). Moving the substrates 18 and 22 away from each other results in application of a release force that overcomes the release strength of the softened adhesive 20 on the first substrate 18 (thereby dissociating the RFID inlay 10 from the first substrate 18) without dissociating the RFID inlay 10 from the second substrate 22. This results in the configuration shown in FIG. 3, for example, with the RFID inlay 10 secured only to the second substrate 22.

If the adhesive 20 on the first substrate 18 is not first softened before dissociating the RFID inlay 10 from the first substrate 18, then care must be taken in selecting appropriate adhesives 20 and 24. In particular, if the adhesive 20 on the first substrate 18 is not first softened, its release strength should be less than the release strength of the adhesive 24 on the second substrate 22. By such a configuration, moving the substrates 18 and 22 away from each other (or by moving one of the substrates 18, 22 away from the other substrate 18, 22) will apply a release force between the substrates 18 and 22. When the release strength of the adhesive 20 on the first substrate 18 is less than the release strength of the adhesive 24 on the second substrate 22, the bond between the RFID inlay 10 and the adhesive 20 on the first substrate 18 will be overcome, thereby dissociating the RFID inlay 10 from the first substrate 18 without dissociating the RFID inlay 10 from the second substrate 22. This results in the configuration shown in FIG. 3, for example, with the RFID inlay 10 secured only to the second substrate 22. Such an approach to dissociating the RFID inlay 10 from the first substrate 18 may be referred to as "differential release," because it relies upon a difference between the release strengths of the adhesives 20 and 24.

After the RFID inlay 10 has been dissociated from the first substrate 18, the first substrate 10 may be wound onto a second reel 48 for reuse (e.g., for receiving additional RFID inlays and then transferring additional RFID inlays to a different substrate, as described herein). Reusing the first substrate 18 rather than disposing of it promotes sustainability while also reducing the costs for manufacturing the RFID devices into which the RFID inlays 10 are incorporated (by reducing the material costs).

With the RFID inlay 10 secured only to the second substrate 22, the assembly may be subjected to further processing. This may include any additional processing without departing from the scope of the present disclosure. In the embodiment of FIG. 6, a third substrate 50 (which may be a liner or back face provided as a web of material) is secured to the RFID inlay 10 (e.g., using an adhesive), with the RFID inlay 10 positioned between the second substrate 22 and the third substrate 50. FIG. 6 also shows (at position 52) the second substrate 22 being cut between adjacent RFID inlays 10 (e.g., by die-cutting or laser-cutting) to define individual RFID tags or labels. With the third substrate 50 still intact, the individual RFID tags or labels may be tested (e.g., as indicated at 54 in FIG. 6), followed by the third substrate 50 being wound onto a finished product reel 56, with the individual RFID tags or labels being ready for removal from the third substrate 50 and attachment to or incorporation into an article or piece of merchandise. Alternatively, if the third substrate 50 is also cut between adjacent RFID inlays 10 to define separate RFID tags or labels, the separate RFID tags or labels may be collected for subsequent attachment to or incorporation into an article or piece of merchandise. Again, it should be understood that the post-dissociation processing steps described above and shown in FIG. 6 are merely exemplary and that other and/or additional processing steps may be employed without departing from the scope of the present disclosure.

FIG. 7 shows another exemplary system 30 (which may be described as having a "super tight pitch" configuration) that may be employed to transfer an RFID inlay 10 from a first substrate 18 to a second substrate 22. Similar to the system 28 of FIG. 6, FIG. 7 shows a system 30 in which both the first substrate 18 and the second substrate 22 are provided on reels 58 and 60, respectively. Both of the substrates 18 and 22 are unwound from their respective reels 58 and 60 by any suitable mechanism (e.g., rollers 62 in the illustrated embodiment). In the illustrated embodiment, the second substrate 22 is provided with a layer of adhesive 24 and a liner 64, with the liner 64 being unwound from the second substrate 22 to expose the adhesive 24. The system 30 of FIG. 7 differs from the system 28 of FIG. 6 because the liner 64 is not immediately wound onto a second reel, but rather is directed along a path that departs from the second substrate 22 (with the first substrate 18 being directed along a path positioned between the diverging paths of the second substrate 18 and the liner 64) before being brought back into the vicinity of the second substrate 22 for attachment to the RFID inlays 10, as will be described in greater detail herein.

The RFID inlays 10 are brought into the vicinity of the second substrate 22, with the adhesive 24 on the second substrate 22 facing the RFID inlays 10 on the first substrate 18. With an RFID inlay 10 in the vicinity of the second substrate 22 (as at the location identified in FIG. 7 at 66), the RFID inlay 10 is secured to the second substrate 22 using the adhesive 24 on the second substrate 22. FIG. 7 shows a tamp 68 being employed to move the first substrate 18 toward the second substrate 22, but other approaches may be employed without departing from the scope of the present disclosure. Securing an RFID inlay 10 to the second substrate 22 results in the configuration shown in FIG. 2 or 4, for example, with the RFID chip 12 in contact with the adhesive 24 on the second substrate 22, while the antenna 14 is in contact with the adhesive 20 on the first substrate 18.

With an RFID inlay 10 secured to the second substrate 22, the RFID inlay 10 is next dissociated from the first substrate 18. This may include first softening the adhesive 20 on the first substrate 18 before dissociating the RFID inlay 10 and the first substrate 18 or instead dissociating the RFID inlay 10 from the first substrate 18 without first softening the adhesive 20 on the first substrate 18, as described above in greater detail with regard to the system 28 of FIG. 6. Regardless of the particular approach employed to dissociate the RFID inlay 10 from the first substrate 18, the result is the configuration shown in FIG. 3, for example, with the RFID inlay 10 secured only to the second substrate 22. After the RFID inlay 10 has been dissociated from the first substrate 18, the first substrate 18 may be wound onto a second reel 70 for reuse, thus promoting sustainability and reducing manufacturing costs.

With the RFID inlay 10 secured only to the second substrate 22, the assembly may be subjected to further processing. In the embodiment of FIG. 7, the liner 64 initially separated from the second substrate 22 is redirected back into the vicinity of the second substrate 22 and secured to the RFID inlay (e.g., using an adhesive that may be applied to the liner 64 between the time that the liner 6 is dissociated from the second substrate 22 and then brought back into the vicinity of the second substrate 22), with the RFID inlay 10 positioned between the second substrate 22 and the liner 64. FIG. 7 also shows (at position 72) the second substrate 22 being cut between adjacent RFID inlays 10 (e.g., by die-cutting or laser-cutting) to define individual RFID tags or labels. With the liner 64 still intact, the individual RFID tags or labels may be tested (e.g., as indicated at 74 in FIG. 7), followed by the liner 64 being wound onto a finished product reel 76, with the individual RFID tags or labels being ready for removal from the liner 64 and attachment to or incorporation into an article or piece of merchandise. Alternatively, if the liner 64 is also cut between adjacent RFID inlays 10 to define separate RFID tags or labels, the separate RFID tags or labels may be collected for subsequent attachment to or incorporation into an article or piece of merchandise. It should be understood that the post-dissociation processing steps described above and shown in FIG. 7 are merely exemplary and that other and/or additional processing steps may be employed without departing from the scope of the present disclosure.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof, including as combinations of features that are individually disclosed or claimed herein.

The invention claimed is:

1. A method of transferring an RFID inlay, comprising:
securing an RFID inlay to a first substrate with a first adhesive;
providing a second substrate with a second adhesive and a liner;
separating the liner from the second substrate to expose the second adhesive;
bringing the RFID inlay into the vicinity of the second substrate;
securing the RFID inlay to the second substrate with the second adhesive;
dissociating the RFID inlay from the first substrate; and
securing a third substrate using an adhesive to the RFID inlay, after the RFID inlay is dissociated from the first substrate, to position the RFID inlay between the second substrate and the third substrate.

2. The method of claim 1, wherein said dissociating the RFID inlay from the first substrate includes softening the first adhesive.

3. The method of claim 2, wherein heat is applied to soften the first adhesive.

4. The method of claim 2, wherein a softening substance is applied to soften the first adhesive.

5. The method of claim 1, wherein the RFID inlay is dissociated from the first substrate without softening the first adhesive.

6. The method of claim 5, wherein
the second adhesive has a greater release strength than the first adhesive, and
the RFID inlay is dissociated from the first substrate by applying a release force between the first and second substrates so as to dissociate the RFID inlay from the first substrate without dissociating the RFID inlay from the second substrate.

7. The method of claim 1, wherein said bringing the RFID inlay into the vicinity of the second substrate includes actuating a tamp to move one of the first and second substrates toward the other one of the first and second substrates.

8. The method of claim 1, wherein
the first substrate comprises a web of material, and
the RFID inlay is brought into the vicinity of the second substrate by unwinding the first substrate from a first reel.

9. The method of claim 1, further comprising winding the first substrate onto a second reel for reuse after dissociating the RFID inlay from the first substrate.

10. The method of claim 1, wherein
the second substrate comprises a web of material, and
the RFID inlay is brought into the vicinity of the second substrate by unwinding the second substrate from a reel.

11. The method of claim 10, wherein
a plurality of RFID inlays are applied to the first substrate, and
successive RFID inlays are sequentially dissociated the first substrate as the first and second substrates are being unwound from their respective reels.

12. The method of claim 11, further comprising winding the second substrate onto a finished product reel after dissociating the RFID inlay from the first substrate.

13. The method of claim 11, further comprising cutting the second substrate to separate successive RFID inlays after dissociating each RFID inlay from the first substrate.

14. The method of claim 10, wherein dissociating the RFID inlay from the first substrate includes directing the first and second substrates in different directions.

15. The method of claim 10, wherein
the second substrate and a third substrate are both unwound from the same reel, and
the third substrate is secured to the RFID inlay after the RFID inlay is dissociated from the first substrate, with the RFID inlay positioned between the second and third substrates.

16. The method of claim 15, wherein the first substrate is directed through a path positioned between a path through which the second substrate is directed and a path through which the third substrate is directed.

17. The method of claim 15, wherein
the third substrate comprises a liner, and
unwinding the second and third substrates from the same reel exposes the second adhesive.

18. The method of claim 10, further comprising applying the second adhesive to the second substrate after unwinding the second substrate from the reel.

19. The method of claim 1, wherein the third substrate is a liner or a back face provided as a web of material.

\* \* \* \* \*